(12) United States Patent
Liang et al.

(10) Patent No.: US 12,135,650 B2
(45) Date of Patent: Nov. 5, 2024

(54) ON-CHIP PACKET CACHING APPARATUS, METHOD AND COMPUTER-READABLE MEDIUM USING IDLE ADDRESS MANAGEMENT MODULE

(71) Applicant: ZTE CORPORATION, Guangdong (CN)

(72) Inventors: Weichao Liang, Guangdong (CN); Jianfeng Zhong, Guangdong (CN); Da Hu, Guangdong (CN); Changsheng Chen, Guangdong (CN); Dongguo Xu, Guangdong (CN); Jianfeng Lu, Guangdong (CN)

(73) Assignee: SANECHIPS TECHNOLOGY CO., LTD., Guangdong (CN)

( * ) Notice: Subject to any disclaimer, the term of this patent is extended or adjusted under 35 U.S.C. 154(b) by 144 days.

(21) Appl. No.: 17/919,345

(22) PCT Filed: Apr. 16, 2021

(86) PCT No.: PCT/CN2021/087872
§ 371 (c)(1),
(2) Date: Oct. 17, 2022

(87) PCT Pub. No.: WO2021/209051
PCT Pub. Date: Oct. 21, 2021

(65) Prior Publication Data
US 2023/0195637 A1 Jun. 22, 2023

(30) Foreign Application Priority Data
Apr. 17, 2020 (CN) .......................... 202010306644.9

(51) Int. Cl.
*G06F 12/0868* (2016.01)
*G06F 12/0817* (2016.01)
*G06F 13/16* (2006.01)

(52) U.S. Cl.
CPC ...... *G06F 12/0868* (2013.01); *G06F 12/0824* (2013.01); *G06F 13/1673* (2013.01)

(58) Field of Classification Search
CPC ............... G06F 13/1668; G06F 12/023; G06F 12/0868; G06F 12/0824; G06F 13/1673;
(Continued)

(56) References Cited

U.S. PATENT DOCUMENTS

| 5,432,918 A | 7/1995 | Stamm |
| 5,666,494 A * | 9/1997 | Mote, Jr. ................. G06F 13/18 |
| | | 711/158 |

(Continued)

FOREIGN PATENT DOCUMENTS

| CN | 101308697 A | 11/2008 |
| CN | 102637148 A | 8/2012 |

(Continued)

OTHER PUBLICATIONS

"The Authoritative Dictionary of IEEE Standards Terms, Seventh Edition," in IEEE Std 100-2000, vol. No. pp. 797, 949, Dec. 11, 2000. (Year: 2000).*

(Continued)

*Primary Examiner* — Charles Rones
*Assistant Examiner* — Hewy H Li
(74) *Attorney, Agent, or Firm* — Li & Cai Intellectual Property (USA) Office

(57) ABSTRACT

The present application provides an on-chip cache apparatus, an on-chip cache on-chip cache read-write method and a computer-readable medium, the on-chip cache apparatus includes: a read-write processing module, a cache module and a memory module; the read-write processing module is connected with the cache module and the memory module respectively, and is configured to store packets into the cache module and the memory module, read packets stored in the cache module and the memory module, and transfer packets cached in the cache module to the memory module for storing; the cache module is connected with the memory module through the read-write processing module, and includes at least one cache register configured to temporarily cache packets; and the memory module is connected with the read-write processing module, and is configured to store the packets cached in the cache module.

18 Claims, 6 Drawing Sheets

(58) Field of Classification Search
CPC ..... G06F 2212/7203; G06F 2212/7207; G06F 2212/7209; G06F 12/0246; G06F 15/7846; G06F 3/0626; G06F 3/0656; G06F 13/16–22; G11C 2207/2245; G11C 11/4076; G11C 11/408; G11C 5/04; Y02D 10/00
See application file for complete search history.

(56) References Cited

U.S. PATENT DOCUMENTS

| | | | |
|---|---|---|---|
| 6,883,044 B1 | 4/2005 | Roohparvar | |
| 7,733,892 B2 | 6/2010 | Cui | |
| 2007/0274303 A1* | 11/2007 | Cui | G06F 12/023 370/363 |
| 2008/0301256 A1* | 12/2008 | McWilliams | G06F 12/0806 714/E11.178 |
| 2016/0188209 A1* | 6/2016 | Hansson | G06F 12/126 711/156 |

FOREIGN PATENT DOCUMENTS

| | | |
|---|---|---|
| CN | 103780506 A | 5/2014 |
| CN | 103543954 B | 3/2018 |
| CN | 110704018 A | 1/2020 |

OTHER PUBLICATIONS

WIPO, International Search Report issued on Jul. 15, 2021.
European Patent Office, EP21788235.6 Extended European Search Report issued on Apr. 16, 2024.

* cited by examiner

ON-CHIP PACKET CACHING APPARATUS, METHOD AND COMPUTER-READABLE MEDIUM USING IDLE ADDRESS MANAGEMENT MODULE

CROSS-REFERENCE TO RELATED APPLICATIONS

The present application claims priority to the Chinese Patent Application No. 202010306644.9 filed on Apr. 17, 2020, the entire contents of which are incorporated herein by reference.

TECHNICAL FIELD

The present application relates to the field of communication chips, and in particular, to an on-chip cache apparatus, an on-chip cache read-write method, and a computer-readable medium.

BACKGROUND

In a network switch engine, due to an expectation for improving performance indicators and limitations of area of a chip, resources and industry, the chip cannot meet the expectation for improving performances by increasing dominant frequency and stacking resources without a limitation, and a method to achieve low redundancy of space of the chip and low consumption of area of the chip is desired to improve performances of the chip.

In chip designs of existing arts, a resource space of the chip is used in different ways in different application scenarios, in a big data processing scene, since a packet with a small packet length is generated and the chip can only store the packet with the small packet length according to a row address, during the chip processing the packet with the small packet length, each row can only store one packet with the small packet length, a large amount of storage space is wasted, and the storage area of the chip is designed to be relatively large to process the packet with the small packet length, thereby a problem of excessive power consumption is caused.

SUMMARY

The present application provides an on-chip cache apparatus, including:
a read-write processing module, a cache module and a memory module; the read-write processing module is connected with the cache module and the memory module respectively, and is configured to store packets into the cache module and the memory module, read packets stored in the cache module and the memory module, and transfer packets cached in the cache module to the memory module for storing; the cache module is connected with the memory module through the read-write processing module, and includes at least one cache register configured to temporarily cache packets; and the memory module is connected with the read-write processing module, and is configured to store the packets cached in the cache module.

The present application provides an on-chip cache read-write method, including:
storing acquired packets into cache registers of a cache module according to a row address; in response to that all the cache registers corresponding to the row address are determined to be occupied, transferring the packets corresponding to the row address in the cache module to a memory module for storing; and reading the packets stored in at least one of the cache module or the memory module according to an address for reading the packets.

The present application further provides a computer-readable medium having a computer program stored thereon, the computer program, when executed by a processor, performs the on-chip cache read-write method described above.

With regard to the above and other aspects of the present application and implementations thereof, further explanation is provided in the brief description of drawings, the detailed description of embodiments and the claims.

DETAIL DESCRIPTION OF EMBODIMENTS

In order to make purposes, technical solutions, and advantages of the present application clearer, embodiments of the present application are described below with reference to the accompanying drawings. It should be noted that the embodiments of the present application and characteristics in the embodiments may be combined with each other if no conflict is incurred.

Since a memory in a chip stores a packet according to a row address, each row in the memory can store only one packet, during the chip being applied to big data processing, a packet with a small packet length is generated in the processing process, the length of the packet is smaller than a length of a common packet, during the chip writing and reading the packet with the small packet length, a large amount of storage space of the memory is wasted, accordingly, a relatively large memory is desired to be configured for the chip, so that an area of the chip is relatively large and a power consumption thereof is excessive. According to the present application, a row address and a column address in a cache are used for caching a plurality of packets with small packet lengths or caching small packet fragments, and then packets in the cache are stored in the memory at one time, a problem that each packet with a small packet length occupies one address in the memory is solved, a utilization rate of the storage space is improved, the area of the chip is reduced, and the power consumption of the chip is reduced.

Figure 1:
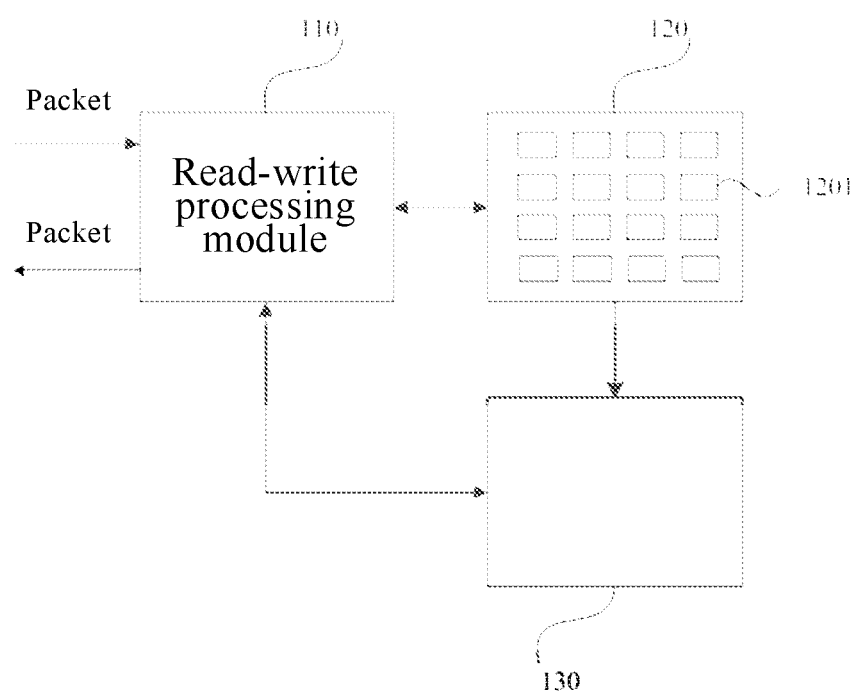
FIG. 1 is a structural schematic diagram of an on-chip cache apparatus according to the present application.

FIG. 1 is a structural schematic diagram of an on-chip cache apparatus according to the present application, and referring to FIG. 1, the on-chip cache apparatus provided in the present application is suitable for processing packets in a chip, the apparatus may be implemented by software and/or hardware, and may generally be integrated in the chip. The on-chip cache apparatus provided in the present application may include a read-write processing module 110, a cache module 120, and a memory module 130.

In some implementations, the on-chip cache apparatus in the chip mainly includes the read-write processing module 110, the cache module 120, and the memory module 130, the read-write processing module 110 may be a hardware processing circuit configured to acquire packets from an access source and read packets to the access source, the cache module 120 may be a cache queue formed by one or more cache registers configured to cache packets, and the memory module 130 may be a random access memory (RAM) configured to exchange packets with the access source in the chip.

The read-write processing module 110 is connected with the cache module 120 and the memory module 130 respectively, and is configured to store packets into the cache module 120 and the memory module 130, read packets stored in the cache module 120 and the memory module 130, and transfer packets cached in the cache module 120 to the memory module 130 for storing.

In some implementations, the read-write processing module 110 is configured to write packets into the chip and read packets from the chip, and is connected with the cache module 120 and the memory module 130, so as to write packets into the cache module 120 and the memory module 130. For example, the packets may be written into the cache module 120 first, and in response to that the number of the packets stored in the cache module 120 exceeds a threshold value or a number of occupied cache registers 1201 in the cache module 120 exceeds a threshold value, the packets stored in the cache module 120 may be transferred and written into the memory module 130, so as to simultaneously write a plurality of packets into the memory module 130, and improve an utilization rate of the storage space. The read-write processing module 110 is further configured to read packets stored in the cache module 120 and the memory module 130, for example, the read-write processing module 110 may read packets from the cache module 120, and then read packets from the memory module 130; or may read packets from the memory module 130 first, and then read packets from the cache module 120.

The cache module 120 may be connected with the cache module 130 through the read-write processing module 110, and may include at least one cache register 1201 configured to temporarily cache packets.

In some implementations, the cache module 120 is a cache register group, and includes at least one cache register 1201, a packet may be cached in the cache register 1201, and further, after the packet is cached, a descriptor of the cache register 1201 may be generated, the descriptor may include a row address and a column address of storing the packet, the row address and the column address can identify a position of the cache register 1201 in the cache module 120. In the on-chip cache apparatus provided in the present application, the cache module 120 can perform a temporary storage function, the packet may be stored in one or more cache registers 1201, in response to that the packet is a common packet, a length of the packet may exceed a bit width of the cache register 1201, a plurality of cache registers 1201 may be used to store one packet, and in response to that the packet is a packet with a small packet length, the length of the packet may be smaller than or equal to the bit width of the cache register 1201, and the packet may be cached in one cache register 1201.

The memory module 130 is connected to the read-write processing module 110, and is configured to store the packets cached by the cache module 120.

In some implementations, the memory module 130 stores packets received by the read-write processing module 110, and the memory module 130 can simultaneously store one or more packets, for example, the read-write processing module 110 can store a threshold number of packets cached in the cache module 120 into the memory module 130, and the threshold number can ensure that a length of the one or more packets stored simultaneously does not exceed a bit width corresponding to a row address of the memory module 130, so as to ensure that packets are successfully stored.

The on-chip cache apparatus provided in the present application includes the read-write processing module, the cache module, and the memory module, the read-write processing module writes packets into the cache module, and then writes packets cached in the cache module into the memory module, the read-write processing module reads packets stored in the cache module and the memory module, and caches a plurality of packets through the cache module, so that a plurality of packets can be written into the memory module simultaneously, an utilization rate of the storage space is improved, a storage area of the chip is reduced, and a power consumption of the chip is reduced.

Figure 2:
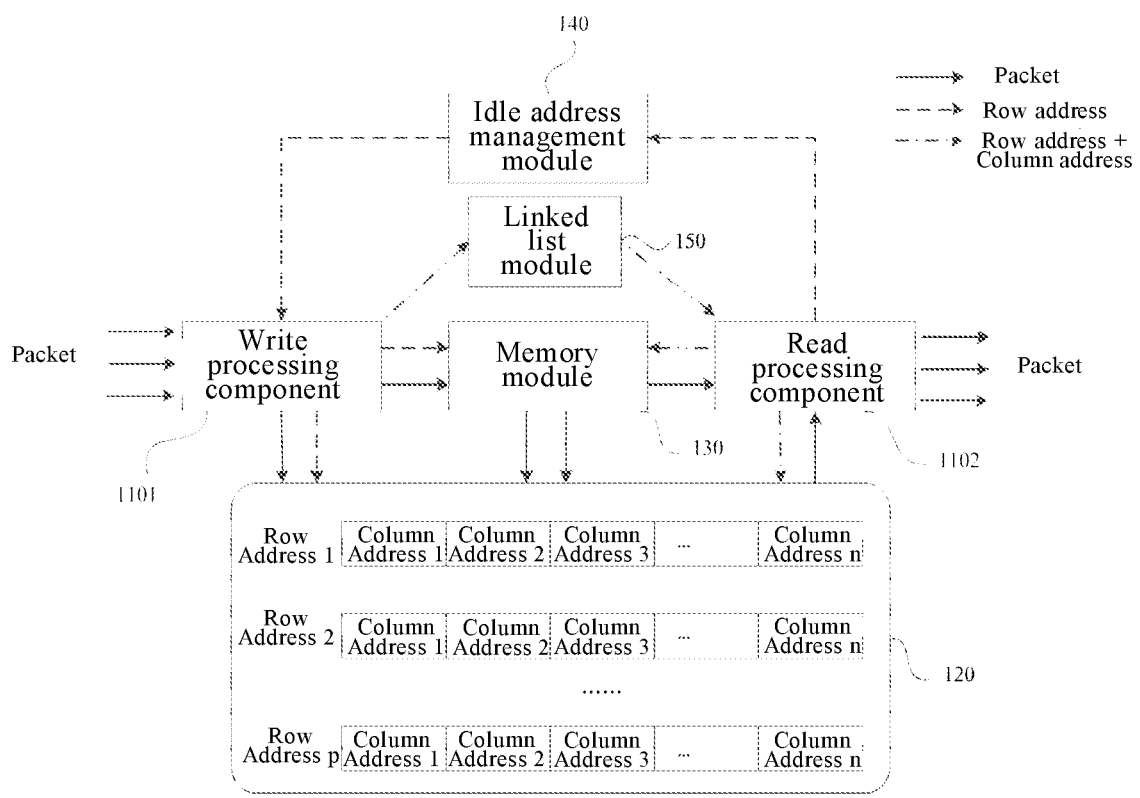
FIG. 2 is a structural schematic diagram of an on-chip cache apparatus according to the present application.

FIG. 2 is a structural schematic diagram of an on-chip cache apparatus according to the present application, which is embodied based on that shown in FIG. 1, a read processing component and a write processing component are respectively used in the read-write processing module to perform read and write operations on packets, and configuration parameters of the cache module and the memory module are detailed. Referring to FIG. 2, the on-chip cache apparatus includes a write processing component 1101, a read processing component 1102, a cache module 120, and a memory module 130.

In some implementations, the on-chip cache apparatus further includes an idle address management module 140 connected with the write processing component 1101 and the read processing component 1102, and configured to manage idle row addresses in the memory module 130, each first-in-first-out buffer (FIFO) in the idle address management module 140 stores the idle row addresses, a depth of the FIFO in the idle address management module 140 is same as a depth of a random access memory (RAM) in the memory module 130, and the depth of the RAM is determined according to a packet transmission rate (a read-write bandwidth) and a reserved speed-up ratio of the RAM in the memory module 130.

That is, in order to improve efficiency for processing the packets, the idle address management module 140 may be configured to uniformly manage the idle row addresses in the memory module 130, the idle row addresses may be row addresses of unoccupied storage spaces in the memory module 130. In the idle address management module 140, the idle row addresses may be stored in a form of FIFO queues, the idle address management module 140 may include at least one FIFO queue, and in order to meet an expectation that the idle address management module 140 manages all addresses of the memory module 130, the depth of the FIFO in the idle address management module 140 may be same as the depth of the RAM in the memory module 130. The depth of the FIFO may indicate a number of FIFO queues storing idle addresses in the idle address management module 140, and the depth of the RAM in the memory module 130 may indicate a capability of processing packets simultaneously by the memory module 130, and may indicate a number of RAMs.

Figure 3:
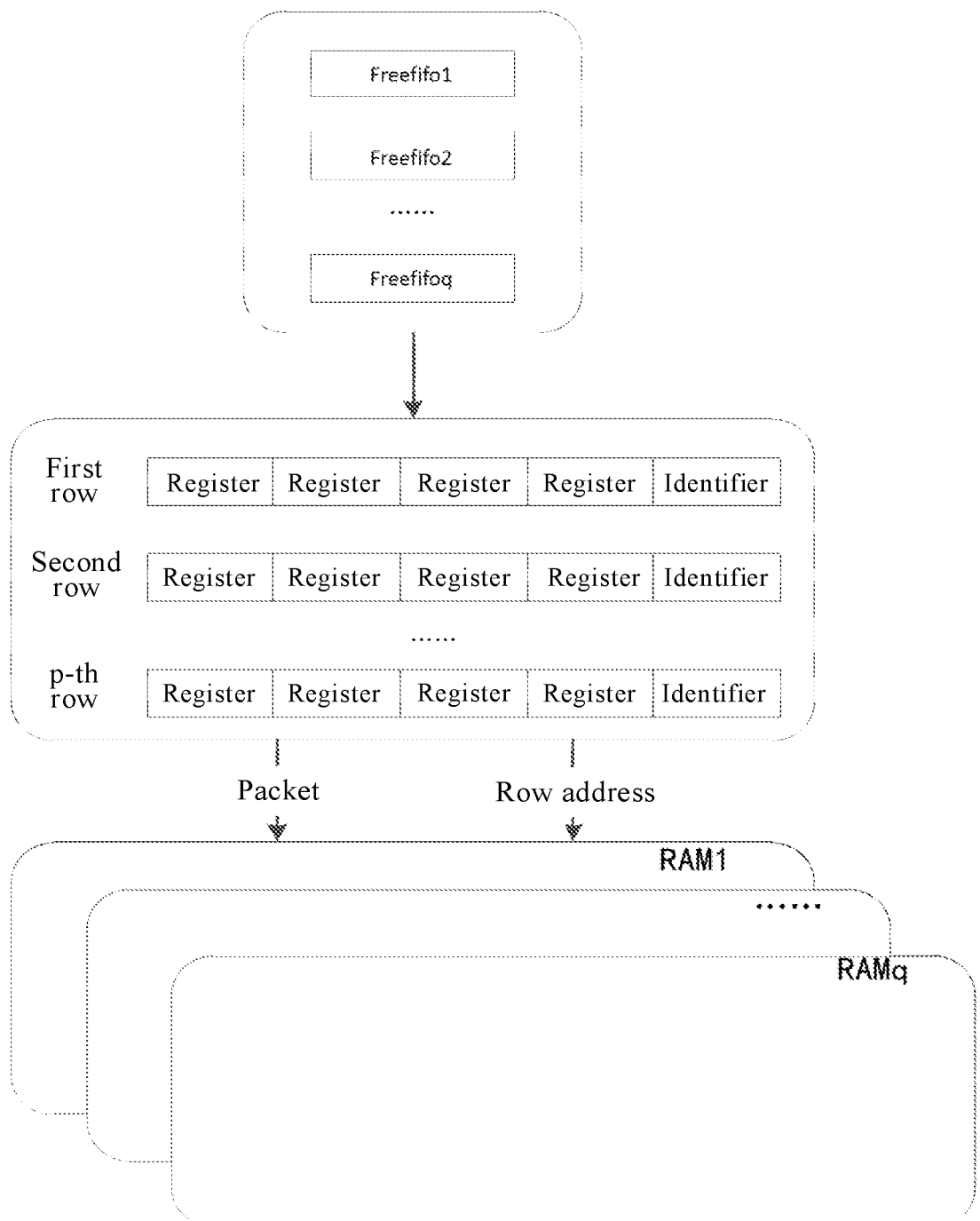
FIG. 3 is a schematic diagram of a depth relationship according to the present application.

In some implementations, the depth of the RAM is related to expectations for a chip, and may be determined by the packet transmission rate (the read-write bandwidth) of the chip and the reserved speed-up ratio, for example, assuming that the number of the packets to be processed per beat is 4, and the speed-up ratio is 50%, the depth of the RAM in the apparatus is 4+4×50%=6. FIG. 3 is a schematic diagram of a depth relationship according to the present application, and referring to FIG. 3, the idle address management module 140 may include q FreeFiFo queues, correspondingly, a number of the RAMs in the memory module 130 may be q, and the depth of the FIFO in the idle address management module 140 is same as the depth of the RAM in the memory module 130.

In some implementations, the write processing component 1101 is connected to the cache module 120, the memory module 130 and the idle address management module 140 respectively, and the write processing component 1101 is configured to receive packets, acquire idle row addresses from the idle address management module 140, store the packets into the cache module 120 according to the idle row addresses, and in response to that all the cache registers 1201 corresponding to the idle row addresses in the cache module 120 are occupied, transfer the packets stored in the cache registers 1201 corresponding to the idle row addresses to the memory module 130 for storing.

In some implementations, the write processing component 1101 is configured to write the packets into the memory module 130, and packet fragments or packets with small packet lengths are cached. The write processing component 1101 may apply for idle row addresses in the idle address management module 140 according to the packets, and cache the packets into the cache module 120 according to the idle row addresses, each idle row address may correspond to a plurality of cache registers in the cache module 120, and each cache register in the cache module 120 may store one packet fragment or one packet with a small packet length. In response to that a cache register corresponding to one idle row address in the cache module 120 stores a packet fragment or a packet with a small packet length, a column address of the cache register 1201 may be marked as 1, and in response to that all column addresses corresponding to the idle row address are marked as 1, all packet fragments or packets with small packet lengths corresponding to the idle row address may be written into the memory module 130 through the write processing component 1101. In some implementations, in response to that the write processing component 1101 determines that all cache registers 1201 corresponding to the idle row address are occupied, the row address and the column address for caching the packets may be simultaneously stored.

In some implementations, the on-chip cache apparatus may further include a linked list module 150, connected with the read processing component 1102 and the write processing component 1101 respectively, and configured to store addresses for storing the packets, the linked list module 150 stores the addresses in a form of linked list, and a number of nodes in the linked list is determined according to a number of read delay beats of the memory for storing the addresses when the linked list retrieves a next address.

That is, a storage address of a packet (i.e., an address storing a packet) may be stored by the linked list module 150, the storage address may include a row address and a column address, and the packet may be read from the cache module 120 and/or the memory module 130 according to the row address and the column address. The linked list module 150 may include registers, and may store a head of a linked list, a tail of the linked list and a pointer of the linked list, contents of each linked list may include row addresses and column addresses of stored packets. It should be understood that, considering an influence on a performance of the chip for processing packets and an area of the chip, in order to improve an utilization rate of area of the chip, a number of nodes of the linked list in the linked list module 150 may be configured according to a number of read delay beats of the memory module when the linked list retrieves a next address.

The read processing component 1102 is connected to the cache module 120, the memory module 130, and the idle address management module 140 respectively, and is configured to read a packet stored in the cache module 120 and/or the memory module 130 according to a row address of the packet, and after reading the packet, store the row address of the packet into the idle address management module 140.

In some implementations, the read processing component 1102 is configured to read a packet, and read packets from the cache module 120 and the memory module 130 respectively according to addresses of the packets, after each packet is read, a column address in the addresses of the packets may be identified as 0). Further, after all packets corresponding to a row address in the addresses of the packets are read, the read processing component 1102 may store the row address as an idle row address into the idle address management module 140. Since a storage space corresponding to each row address can store a plurality of packets with small packet lengths or packet fragments, a pointer to the row address is to be released only after all the packets with small packet lengths corresponding to the row address are read, after a descriptor corresponding to the row address is obtained from the linked list in each read operation, the cache module 120 is retrieved first, if no row address corresponding to the descriptor is retrieved, then the packets are to be read from the memory module 130, so that a frequency of reading/writing for the memory module 130 can be reduced, a power consumption is reduced, and access conflicts can be reduced.

In some implementations, a number of storage components in the memory module 130 is determined according to a bit width of a read-write bus of an access source and a length of each packet, and the memory module 130 includes a memory with a single-access bus.

In some implementations, an area of the memory is to be reduced by replacing a memory with multiple read-write buses with the memory with the single-access bus, the memory in the memory module 130 may be the memory with the single-access bus, a space size of each row address of the RAM in the memory module 130 may be determined by a bit width of a bus of the access source, and according to a length of each packet, it is determined how many storage components, for storing packets with small packet lengths or packet fragments, may be divided from each row address. For example, assuming that a length of the packet with a small packet length is 64 bytes, and a width of each row address is 600 bytes, in a case where a maximum of six packets with small packet lengths can be written in each period, the row address in the memory module 130 is desired to be divided into six storage components for storing the packets with the small packet lengths or the packet fragments.

In some implementations, the cache module 120 includes at least one cache register group, the cache register group includes at least one cache register, a number of cache register groups in the cache module 120 may be determined according to a number of read delay beats of a descriptor of the cache register and a number of reserved bursts to be processed, a number of cache registers in each cache register group is determined based on a number of storage components corresponding to an address space of a row address in the memory module 130.

In some implementations, the cache module 120 includes a plurality of cache register groups, each cache register group includes a plurality of cache registers, a storage space of each cache register corresponds to a column address of the RAM of the memory module 130, a storage space corresponding to the row address of the memory module 130 may be divided by caching the packets with small packet lengths or the packet fragments in the cache registers, the packets with the small packet lengths or the packet fragments in multiple cache registers may be stored into one row address of the RAM in the memory module 130, a storage space of each cache register is same as a storage space corresponding to one storage component in the memory module 130, and the cache register may correspond to a column address of the storage component. The number of cache registers in the cache module 120 may be related to hardware parameters of the memory module 130, and may be determined by the number of the read delay beats of the descriptor of the cache register and the number of the reserved bursts to be processed.

In some implementations, the on-chip cache apparatus further includes a conflict handling module connected with the read processing component 1102 and the write processing component 1101 respectively, and configured to process an abnormal conflict for reading and/or writing a packet in the cache module 120 and/or the memory module 130.

In the existing art, the conflict in a cache RAM may include three types, including a read-write conflict between reading and writing, a write-write conflict between writings and a read-read conflict between readings, and in the on-chip cache apparatus provided in the present application, the cache module 120 is configured to cache the packets with the small packet lengths or cache packets fragments, the idle address management module 140 can ensure that different idle row addresses are issued, thereby it is ensured that the write-write conflict between writings would not occur. In response to the read-write conflict between reading and writing occurs, only a case where a read operation and a write operation are simultaneously performed on one row address occurs, and in such case, the idle address management module 140 removes the row address to be read first, and meanwhile, the write operation is to be performed on the memory module 120 after one register group is full, so as to reduce a probability of conflict; in response to the read-read conflict between readings occurs, priority scheduling may be used to ensure that an access source with a higher priority reads data first. For a conflict of accessing the cache register, the conflict is handled according to priorities. A conflict handling mechanism for handling conflicts is implemented in the read-write processing module.

Figure 4:
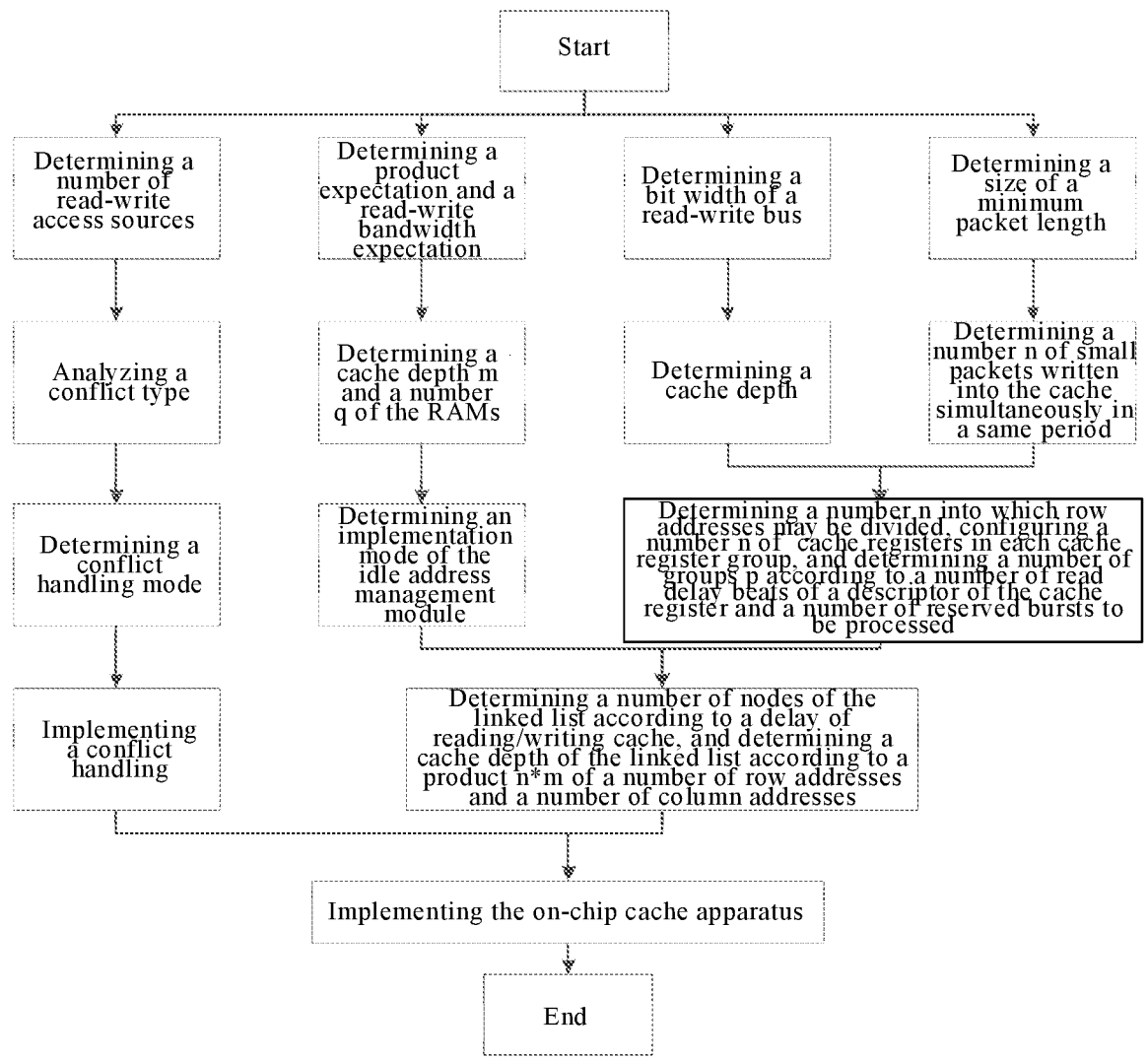
FIG. 4 is an example diagram of a configuration of an on-chip cache apparatus according to the present application.

For example, FIG. 4 is an example diagram of a configuration of an on-chip cache apparatus according to the present application, and referring to FIG. 4, in the on-chip cache apparatus provided in the present application, parameters in the read-write processing module, the cache module, and the memory module are configured according to a number of read-write access sources, a product expectation, a read-write bandwidth expectation, a bit width of a read-write bus, a size of a minimum packet length, etc. of the chip, and a conflict type, a conflict handling mode, an implementation mode of the idle address management module, a number of the RAMs, a number of the cache registers, a number of nodes of the linked list, and the like are respectively determined, so that an efficient on-chip cache apparatus is implemented, a utilization rate of a storage space of the chip is improved, an area of the chip is reduced, and a power consumption of the chip is reduced.

Figure 5:
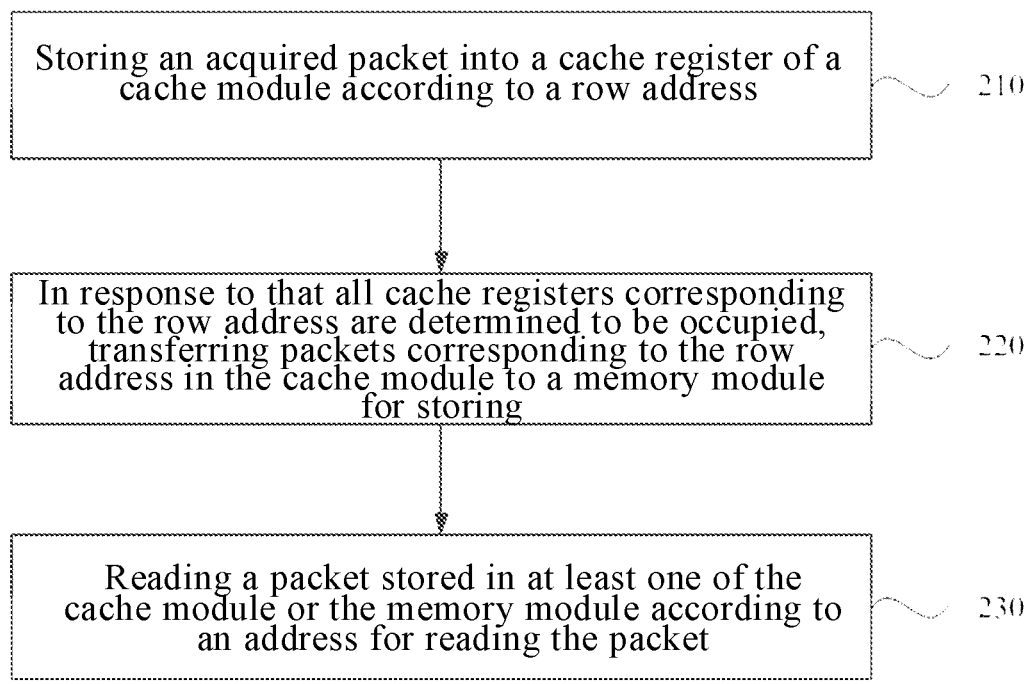
FIG. 5 is a schematic flowchart of an on-chip cache read-write method according to the present application.

FIG. 5 is a schematic flowchart of an on-chip cache read-write method according to the present application, the on-chip cache read-write method provided in the present application is suitable for processing packets in the chip, and the method may be executed by the on-chip cache apparatus provided in the present application, the on-chip cache apparatus may be implemented by software and/or hardware, and generally may be integrated in the chip, and the method provided in the present application includes the following operations 210 to 230.

At operation 210, storing an acquired packet into a cache register of a cache module according to a row address.

The packet may be a packet generated during big data processing, and may include a packet with a common length or a packet with a small packet length, and the packet may be read and written by the on-chip cache apparatus.

In some implementations, the acquired packet may be first cached in the cache register of the cache module, and the packet may be cached according to the row address. In response to that the packet is a common packet (i.e., with a common length), a length of the packet may exceed a storage space of each cache register, the packet may be fragmented into packet fragments, the packet fragments are respectively stored in the cache registers corresponding to the row address in the cache module, each cache register may store one packet fragment; and in response to that the packet is the packet with the small packet length, the packet with the small packet length may be stored in one cache register in the cache module.

At operation 220, in response to that all the cache registers corresponding to the row address are determined to be occupied, transferring packets corresponding to the row address in the cache module to a memory module for storing.

In some implementations, each row address in the cache module may correspond to one cache register group, each cache register group may include a plurality of cache registers, whether the cache register corresponding to the row address is occupied may be determined by determining whether the column address corresponding to the row address is identified as 1, and in response to that all the cache registers corresponding to the row address are occupied, packets stored in the cache registers corresponding to the row address may be transferred to the memory module for storing, and the packets stored in the cache registers may be simultaneously written into one row in a RAM of the memory module. It should be understood that the row address in the cache module may be the same as the row address in the memory module, or row addresses in the cache module and row addresses in the memory module have a corresponding relationship therebetween.

At operation 230, reading a packet stored in at least one of the cache module or the memory module according to an address for reading the packet.

The address for reading the packet may be an address for reading the stored packet, for example, may be a descriptor, and at least includes a row address and a column address of the stored packet.

That is, the stored packet may be read according to the address for reading the packet, and in the present application, packets may be stored in the cache module and the memory module, and may be respectively read from the cache module and the memory module according to addresses for reading the packets, for example, the stored packet may be read from the cache module first, in response to that no packet corresponding to the address for reading the packet exists in the cache module, the stored packet is read from the memory module, and it should be understood that the stored packet may also be simultaneously read from the cache module and the memory module according to the address for reading the packet.

In the on-chip cache read-write method provided in the present application, the acquired packets are stored into the cache registers in the cache module according to the row address, in response to that all the cache registers corresponding to the row address are determined to be occupied, the packets corresponding to the row address in the cache module are transferred to the memory module for storing, and the stored packets in at least one of the cache module or the memory module are read according to the addresses for reading the packets, so that multiple packets can be simultaneously written into the memory module, an utilization rate of the storage space is improved, a storage area of the chip can be reduced, and a power consumption of the chip can be reduced.

Figure 6:
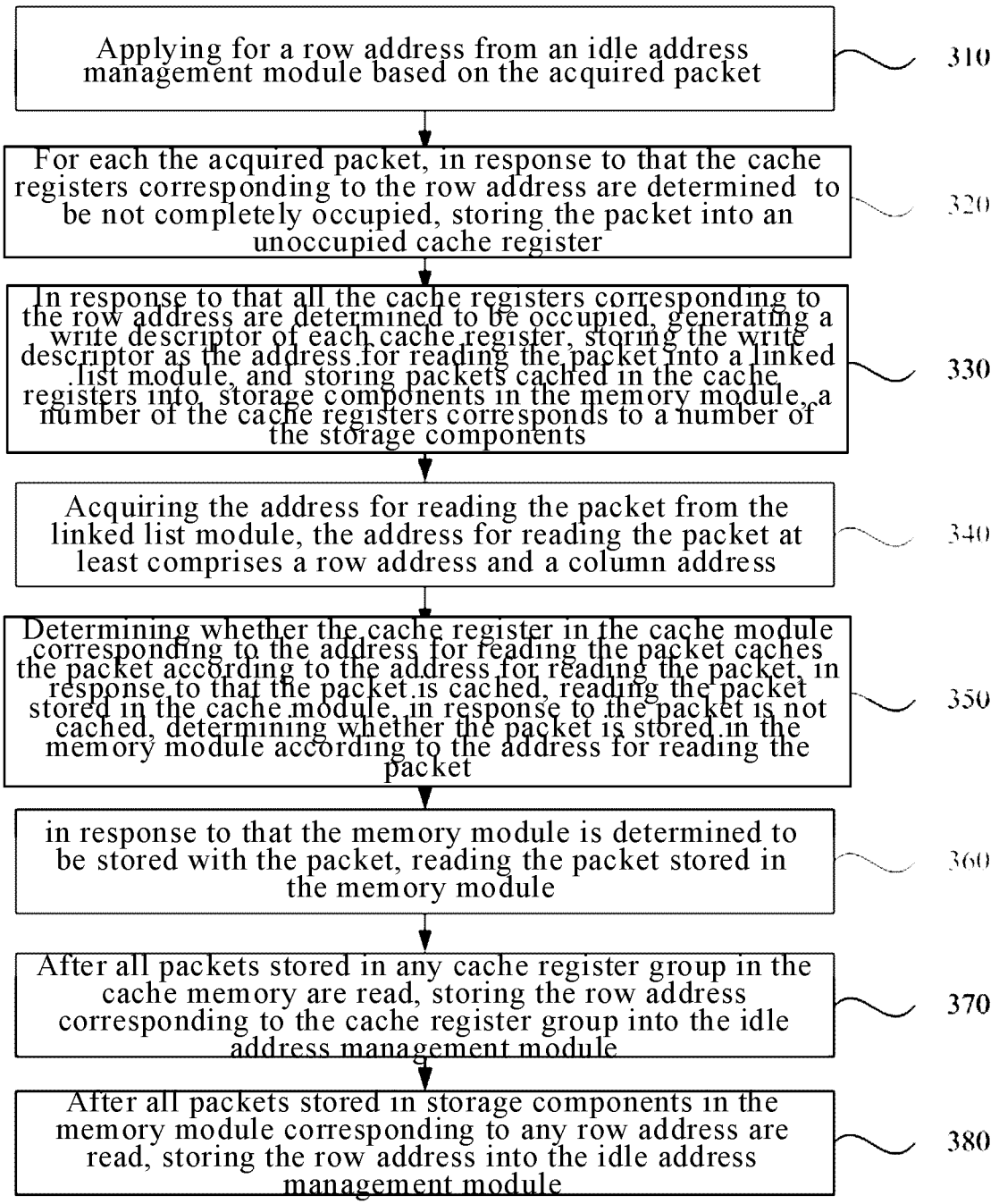
FIG. 6 is a schematic flowchart of an on-chip cache read-write method according to the present application.

FIG. 6 is a schematic flowchart of an on-chip cache read-write method according to the present application, based on the above, processes of writing and reading packets are further detailed, and referring to FIG. 6, the on-chip cache method includes operations 310 to 380.

At operation 310, applying for a row address from an idle address management module based on an acquired packet.

The idle address management module may be a module performing unified management on idle row addresses, and row addresses of unoccupied storage spaces may be stored in the idle address management module.

In the operation 310, in response to that a packet from a read-write access source is received, a row address for storing the packet may be applied from the idle address management module, the row address may correspond to a storage space of the cache module and/or the memory module.

At operation 320, for each packet, in response to that cache registers corresponding to the row address are determined to be not completely occupied, storing the packet into the cache register unoccupied.

That is, packets may be cached in the cache module first, and since all the cache registers corresponding to the row address in the cache module are occupied, the packets are desired to be transferred from the cache module to the memory module for storing, and before each packet is stored, whether all the cache registers corresponding to the row address are occupied may be determined, in response to that there is any unoccupied cache register, the packet may be stored in the unoccupied cache register corresponding to the row address.

At operation 330, in response to that all the cache registers corresponding to the row address are determined to be occupied, generating a write descriptor of each cache register, storing the write descriptor as an address for reading the packet into a linked list module, and storing packets cached in the cache registers into storage components in the memory module, a number of the cache registers corresponds to a number of the storage components.

The write descriptor may be information which describes a storage location of the packet, and in particular, may include a row address and a column address of the packet.

In some implementations, in response to that all the cache registers corresponding to any row address are occupied in the cache module, for example, in response to that all column addresses corresponding to the row address are marked as 1, it may be considered that the cache register group in the cache module is fully stored with packets, the packets stored in the cache register group may be transferred from the cache module to the memory module for storing. In order to facilitate a search for stored packets, write descriptors corresponding to the packets may be stored in the linked list module. In the present application, for transferring the packets from the cache module to the memory module for storing, the packets stored in each cache register in the cache module may be stored in one storage component in the memory module, a number of cache registers corresponding to each row address is same as a number of storage components corresponding to the row address, with the cache registers, packets may be stored in the memory module according to column addresses, so that a space occupancy of the packets is improved.

At operation 340, acquiring the address for reading the packet from the linked list module, with the address for reading the packet including at least a row address and a column address.

The address for reading the packet may be a storage address of the packet (i.e., an address storing the packet), and may be used to read the packet.

That is, the storage address of the packet in the cache module and the memory module may be located in the linked list module, a desired address for reading the packet may be acquired by searching linked list information in the linked list module. Further, each address for reading the packet may include a row address and a column address, and in particular, may correspond to one cache register in the cache module or one storage component in the memory module.

At operation 350, determining whether the cache register in the cache module corresponding to the address for reading the packet caches the packet according to the address for reading the packet, in response to that the cache register in the cache module caches the packet, reading the packet stored in the cache module, in response to that the packet is not cached in the cache register of the cache module, determining whether the packet is stored in the memory module according to the address for reading the packet.

In the on-chip cache read-write method provided in the present application, the stored packet may be read from the cache module first, and then read from the memory module, so that the frequency of reading the memory module can be reduced, a power consumption can be reduced, and an occurrence probability of an access conflict can be reduced. That is, the cache register corresponding to the address for reading the packet may be searched according to the address of reading the packet, if the cache register does not store data, the packet is not stored in the cache module, the packet may be searched from the memory module, and if the cache register stores data, the data in the cache register is read out as the packet.

At operation 360, in response to that the memory module is determined to store the packet, reading the packet stored in the memory module.

That is, the storage component in the memory module may be searched according to the address for reading the packet, and in response to that there is data stored in the storage component, the data is read out as the packet, and it should be understood that in response to that no data is stored in the storage component, the packet is determined to be not stored, and an error may be reported.

At operation 370, after all packets stored in any cache register group in the cache memory are read, storing a row address corresponding to the cache register group into the idle address management module.

That is, after the stored packets are read, the storage space is desired to be released, in the on-chip cache read-write method provided in the present application, after all the packets stored in any cache register group in the cache module are read, i.e., after all the packets stored in the cache registers corresponding to any row address are read, the cache registers corresponding to the row address may be cleared, and the row address is stored as an idle address into the idle address management module.

At operation 380, after all the packets stored in storage components in the memory module corresponding to any row address are read, storing the row address into the idle address management module.

That is, since each row address in the memory module may store a plurality of packets with small packet lengths or packet fragments, only after all the packets with the small packet lengths or the packet fragments corresponding to the row address are read, a pointer to the row address in the memory module may be released, and then, by using a mark based on a cache depth, for recovering each column address, the mark of the column address may be set to 0, after marks of all column addresses corresponding to the row address are set to 0, the row address is stored in the idle address management module.

In the on-chip cache read-write method provided in the present application, the row address corresponding to the acquired packet is applied from the idle address management module, the packet is firstly cached in the cache module according to the row address, after all the cache registers corresponding to the row address are occupied, the packet is transferred from the cache register in the cache module to the storage component in the memory module for storing, and the address for reading the packet is stored into the linked list module, for performing a read operation, the address for reading the packet stored in the linked list module is acquired, and the packet is sequentially read from the cache module and the memory module according to the address for reading the packet, after all packets stored in any cache register group or in the storage components corresponding to any row address are read, the row address is stored into the idle address management module, so that an unified management of idle addresses is implemented, a frequency of reading and/or writing the memory module is reduced, a power consumption of the chip is reduced, and a conflict for accessing the packet is reduced.

In some implementations, the on-chip cache read-write method further includes: in response to that the read-write conflict occurs, clearing the idle row address with the conflict in the idle address management module, so that the read processing component in the read-write processing module does not read packets based on the idle row address, and the write processing component in the read-write processing module writes packets based on the idle row address; and in response to that the read-read conflict occurs, reading, by an access source, packets in the read-write processing module according to a priority order.

In the existing art, a conflict in a cache RAM may include three types, including a read-write conflict between reading and writing, a write-write conflict between writings and a read-read conflict between readings, and in the on-chip cache apparatus provided in the present application, the cache module is configured to cache the packets with the small packet lengths or the packets fragments, the idle address management module can ensure that different idle row addresses are issued, thereby it is ensured that the write-write conflict does not occur. In response to that the read-write conflict between reading and writing occurs, only a case where a read operation and a write operation are simultaneously performed on one row address occurs, and in such case, the idle address management module removes the row address to be read first, and meanwhile, the write operation is to be performed on the memory module after one register group is full, so as to reduce a probability of conflict; in response to that the read-read conflict between readings occurs, priority scheduling may be used to ensure that an access source with a higher priority reads data first. For a conflict of accessing the cache register, the conflict is handled according to priorities.

The above description is merely a schematic explanation of the present application, rather than limiting the protection scope of the present application.

The present application may be implemented in hardware or dedicated circuits, software, logics, or any combination thereof. For example, some aspects may be implemented in hardware, while other aspects may be implemented in firmware or software which may be executed by a controller, a microprocessor or other computing devices, although the present application is not limited thereto.

The present application may be implemented by a data processor executing computer program instructions, for example, in a processor entity, or by hardware, or by a combination of software and hardware. The computer program instructions may be assembler instructions, instruction set architecture (ISA) instructions, machine instructions, machine-related instructions, microcode, firmware instructions, state setting data, or source or object codes written in any combination of one or more programming languages.

The block diagram of any logical flowchart in the accompanying drawings of the present application may represent program operations; or represent interconnected logic circuits, modules, and functions; or represent a combination of program operations and logic circuits, modules and functions. The computer program instructions may be stored in a computer readable medium such as a storage device. The storage device may be of any type suitable for the local technical environment and may be implemented by using any suitable data storage technology, includes, but is not limited to, a Random Access Memory (RAM), a Read-Only Memory (ROM), an optical storage device and system (a digital video disc (DVD) or a compact disc (CD)) and the like. The computer-readable medium may include a non-transitory storage medium. The data processor may be of any type suitable for the local technical environment, includes, but is not limited to, a general computer, a specific computer, a microprocessor, a digital signal processor (DSP), an application specific integrated circuit (ASIC), a field programmable gate array (FPGA), and a processor based on a multi-core processor architecture.

The above description provides a detailed description of exemplary embodiments of the present application, which are examples but not limited. In conjunction with the accompanying drawings and claims, various modifications and adjustments for the above examples are apparent for those skilled in the art, but do not depart from scope of the present application. The scope of the present application is determined by the claims.

What is claimed is:

1. An on-chip cache apparatus, comprising:
 a read-write processing module, a cache module and a memory module, wherein the read-write processing module is connected with the cache module and the memory module respectively, and is configured to store packets into the cache module and the memory module, read packets stored in the cache module and the memory module, and transfer packets cached in the cache module to the memory module for storing;

the cache module is connected with the memory module through the read-write processing module, and comprises at least one cache register configured to temporarily cache the packets; and the memory module is connected with the read-write processing module, and is configured to store the packets cached in the cache module;

wherein the on-chip cache apparatus further comprises:

an idle address management module connected with the read-write processing module and configured to manage idle row addresses in the memory module, each first-in-first-out buffer in the idle address management module stores the idle row addresses, a depth of the first-in-first-out buffer in the idle address management module is same as a depth of a random access memory in the memory module, wherein the depth of the random access memory is determined according to a packet transmission rate of the random access memory in the memory module and a reserved speed-up ratio.

2. The apparatus of claim 1, wherein the read-write processing module comprises a write processing component connected to the cache module, the memory module and the idle address management module respectively, and configured to receive the packet, acquire the idle row address from the idle address management module, store the packet into the cache module according to the idle row address, and in response to that all cache registers corresponding to the idle row address in the cache module are occupied, transfer packets stored in the cache registers corresponding to the idle row address to the memory module for storing.

3. The apparatus of claim 2, wherein a number of storage components in the memory module is determined according to a bit width of a read-write bus of an access source and a length of the packet, the memory module comprises a memory with a single-access bus.

4. The apparatus of claim 3, wherein the cache module comprises at least one cache register group, the cache register group comprises at least one cache register, wherein a number of cache register groups in the cache module is determined according to a number of read delay beats of a descriptor of the cache register and a number of reserved bursts to be processed, a number of cache registers in the cache register group is determined based on a number of storage components corresponding to an address space of each row address in the memory module.

5. The apparatus of claim 4, further comprising:

a linked list module connected with the read-write processing module, and configured to store storage addresses for storing the packets, the linked list module stores the storage addresses in a form of a linked list, and a number of nodes of the linked list is determined according to a number of read delay beats of the memory module during the linked list retrieving a next address.

6. The apparatus of claim 4, further comprising:

a conflict handling module connected with the read-write processing module and configured to process an abnormal conflict for reading and writing the packet in at least one of the cache module or the memory module.

7. The apparatus of claim 1, wherein the read-write processing module comprises a read processing component connected to the cache module, the memory module, and the idle address management module respectively, and configured to read the packet stored in at least one of the cache module or the memory module according to an address of the packet, and after reading the packet, store the address of the packet into the idle address management module.

8. The apparatus of claim 7, wherein a number of storage components in the memory module is determined according to a bit width of a read-write bus of an access source and a length of the packet, the memory module comprises a memory with a single-access bus.

9. The apparatus of claim 8, wherein the cache module comprises at least one cache register group, the cache register group comprises at least one cache register, wherein a number of cache register groups in the cache module is determined according to a number of read delay beats of a descriptor of the cache register and a number of reserved bursts to be processed, a number of cache registers in the cache register group is determined based on a number of storage components corresponding to an address space of each row address in the memory module.

10. An on-chip cache read-write method, comprising:

acquiring a packet;

applying for an idle row address from an idle address management module based on the packet;

storing the packet into a cache register of a cache module according to the idle row address;

determining that all cache registers corresponding to the idle row address are occupied; and in response to determining that all the cache registers corresponding to the idle row address are occupied, transferring packets corresponding to the idle row address in the cache module to a memory module for storing, wherein the idle row address is a row address of unoccupied storage spaces in the memory module.

11. The method of claim 10, further comprising:

reading a target packet stored in at least one of the cache module or the memory module according to an address for reading the target packet.

12. The method of claim 10, wherein transferring the packets corresponding to the idle row address in the cache module to the memory module for storing comprises:

storing packets cached in the cache registers into storage components in the memory module, wherein a number of the cache registers corresponds to a number of the storage components.

13. The method of claim 11, wherein reading the target packet stored in at least one of the cache module or the memory module according to an address for reading the target packet comprises:

determining whether the target packet is cached in the cache register of the cache module corresponding to the address for reading the target packet according to the address for reading the target packet;

in response to determining that the cache register in the cache module caches the target packet, reading the target packet stored in the cache module, in response to determining that the target packet is not cached in the cache register of the cache module, determining whether the target packet is stored in the memory module according to the address for reading the target packet;

in response to determining that the target packet is stored in the memory module, reading the target packet stored in the memory module.

14. The method of claim 13, further comprising:
acquiring the address for reading the target packet from a linked list module, wherein the address for reading the target packet comprises at least a row address and a column address.

15. The method of claim 13, further comprising:
after all packets stored in any cache register group in the cache module and corresponding to a first row address are read, storing the first row address corresponding to the cache register group into the idle address management module; or
after all packets stored in the storage components in the memory module corresponding to a second row address are read, storing the second row address into the idle address management module.

16. The method of claim 10, further comprising:
determining that at least one of a read-write conflict and a read-read conflict occurs;
in response to determining that the read-write conflict occurs, clearing an idle row address with the conflict in the idle address management module, so that a read processing component in a read-write processing module does not read packets based on the idle row address with the conflict, and a write processing component in the read-write processing module writes packets based on the idle row address with the conflict; and
in response to determining that the read-read conflict occurs, reading, by an access source, packets in the read-write processing module according to a priority order.

17. A non-transitory computer-readable medium having a computer program stored thereon, the computer program, when executed by a processor, performs the method of claim 10.

18. The method of claim 10, further comprising:
after storing the packet into the cache register of the cache module, generating a write descriptor of the cache register;
storing the write descriptor as an address for reading the packet into a linked list module.

* * * * *